(12) United States Patent
Liu et al.

(10) Patent No.: US 6,635,576 B1
(45) Date of Patent: Oct. 21, 2003

(54) METHOD OF FABRICATING BORDERLESS CONTACT USING GRADED-STAIR ETCH STOP LAYERS

(75) Inventors: Meng-Chang Liu, Chia-yi (TW); Lin-June Wu, Hsin-Chu (TW); Kwang-Ming Lin, Hsin-Chu (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/999,343

(22) Filed: Dec. 3, 2001

(51) Int. Cl.[7] .............................................. H01L 21/302
(52) U.S. Cl. ...................... 438/700; 438/723; 438/724
(58) Field of Search .................................. 438/624, 637, 438/638, 700, 702, 723, 724

(56) References Cited

U.S. PATENT DOCUMENTS

| | | | | |
|---|---|---|---|---|
| 5,792,703 A | * | 8/1998 | Bronner et al. | 438/620 |
| 6,020,255 A | * | 2/2000 | Tsai et al. | 438/618 |
| 6,046,103 A | | 4/2000 | Thei et al. | 438/624 |
| 6,072,237 A | | 6/2000 | Jang et al. | 257/698 |
| 6,074,908 A | | 6/2000 | Huang | 438/241 |
| 6,225,211 B1 | * | 5/2001 | Tsui | 438/624 |
| 6,323,118 B1 | * | 11/2001 | Shih et al. | 438/624 |
| 6,339,027 B1 | * | 1/2002 | Chok | 438/692 |

* cited by examiner

*Primary Examiner*—Kin-Chan Chen
(74) *Attorney, Agent, or Firm*—George O. Saile; Stephen B. Ackerman

(57) ABSTRACT

The invention teaches the creation of borderless contact holes by using multiple layers of overlying dielectric, having different, interdependent etch rates, that function as etch stop layers for the creation of the borderless contact holes through a layer of overlying dielectric.

29 Claims, 5 Drawing Sheets

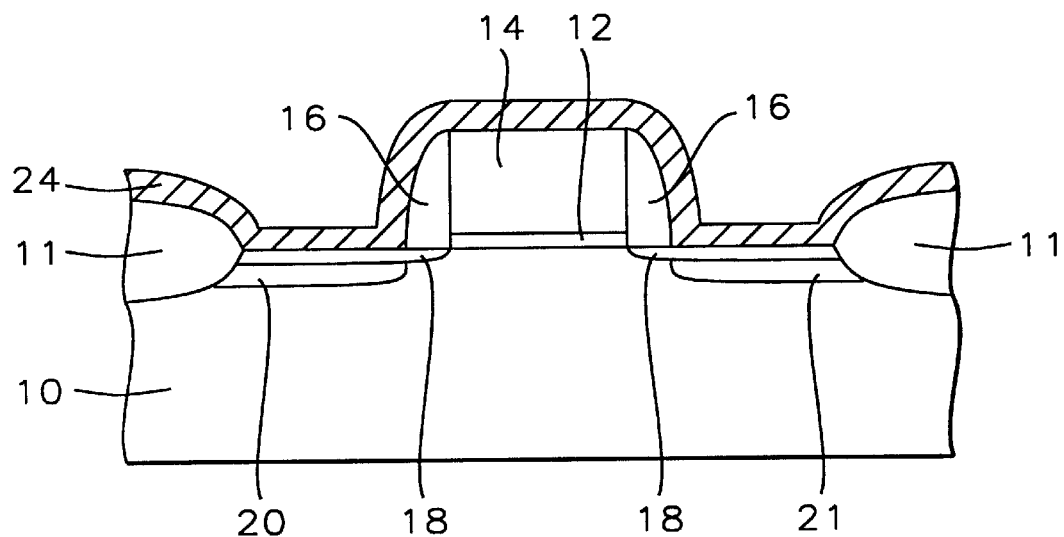
FIG. 1 - Prior Art
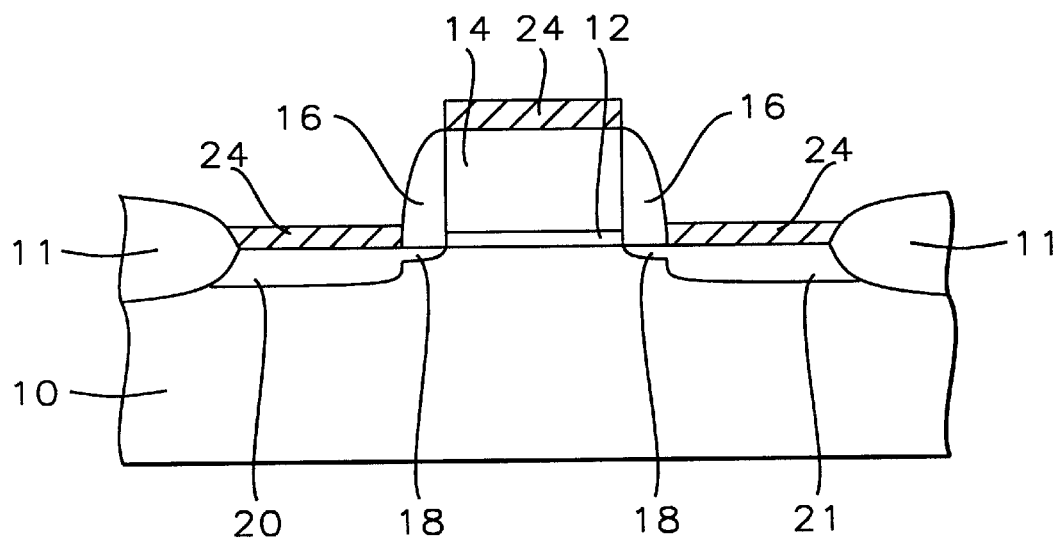
FIG. 2 - Prior Art

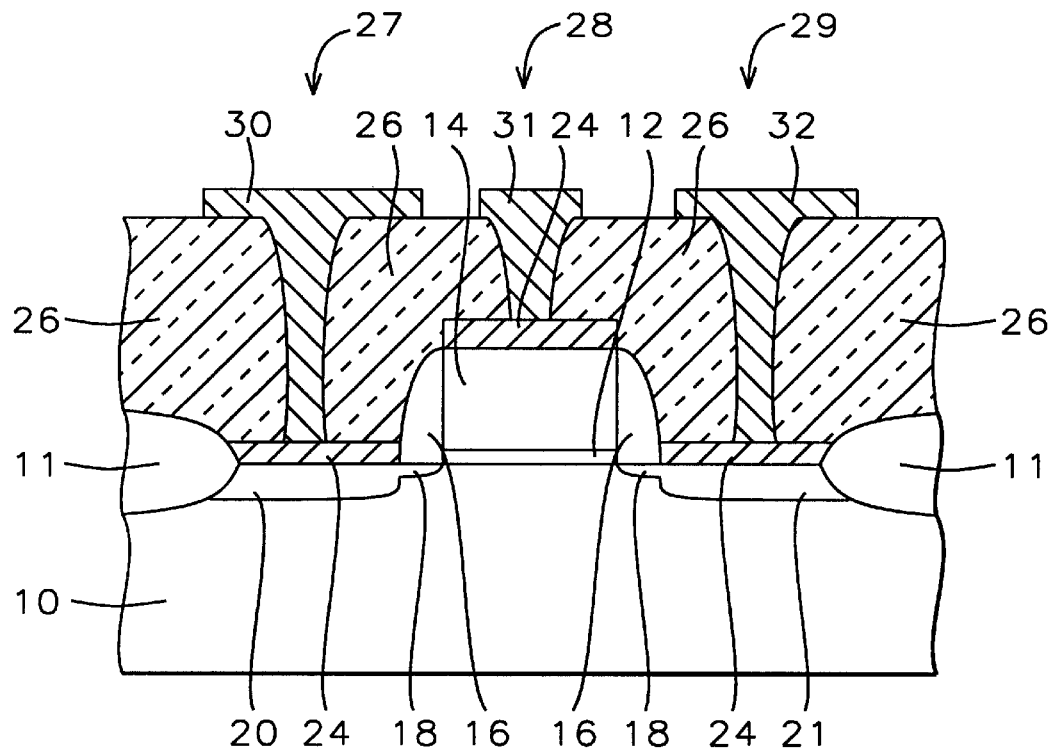
*FIG. 3 - Prior Art*
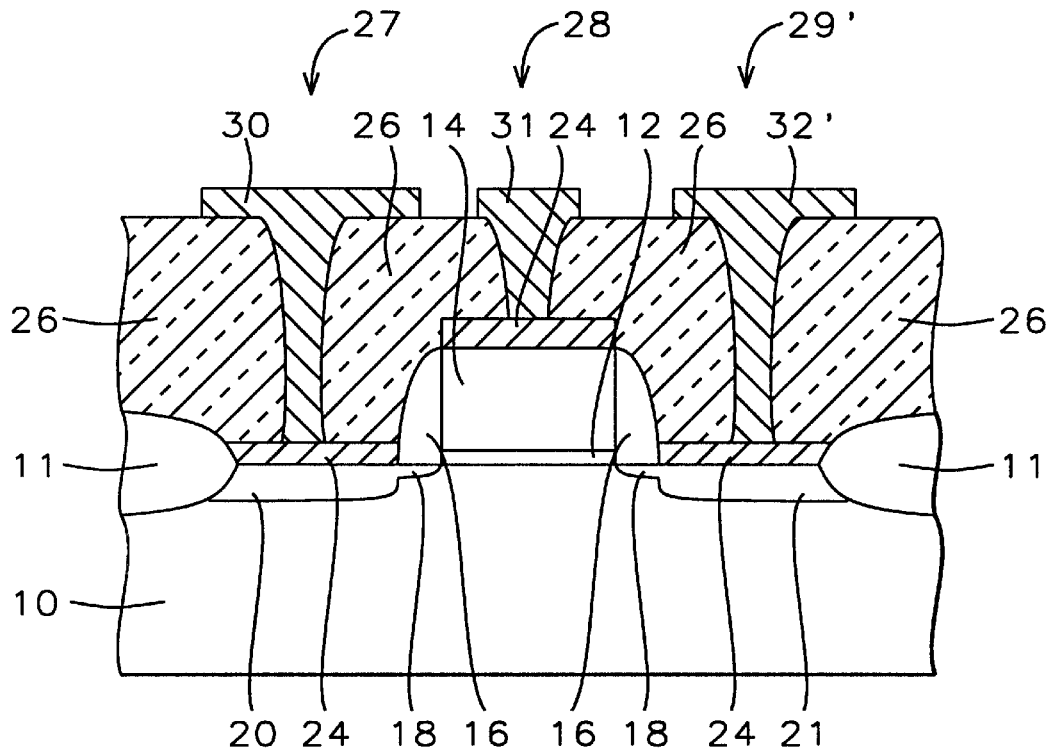
*FIG. 4 - Prior Art*

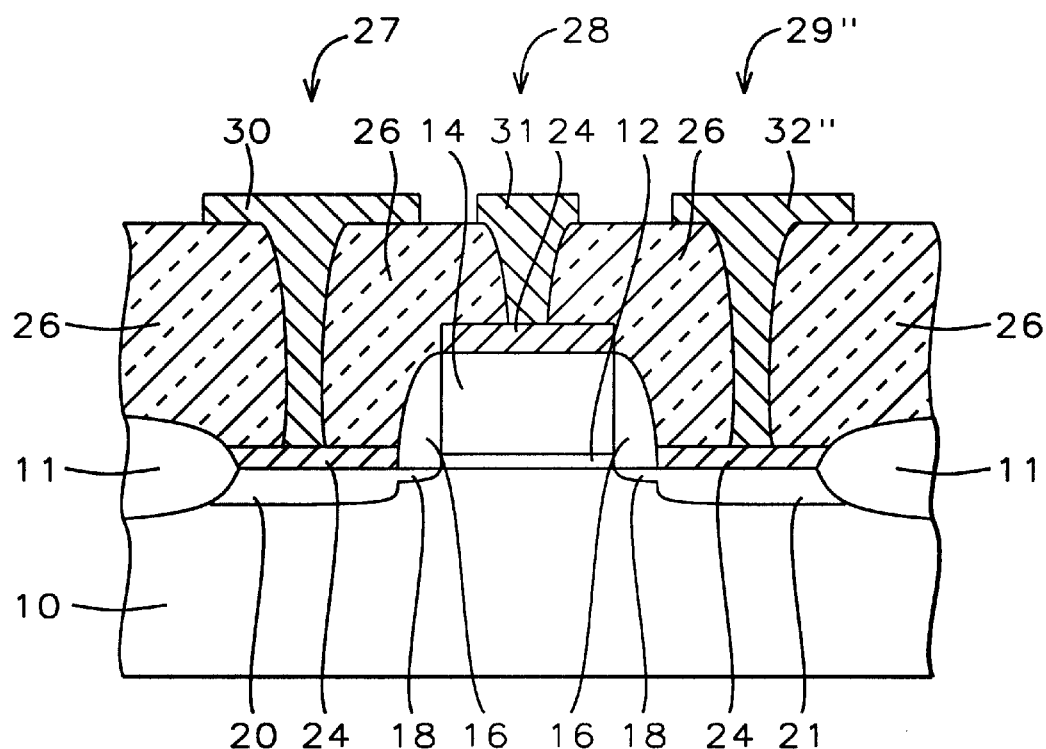
FIG. 5 – Prior Art
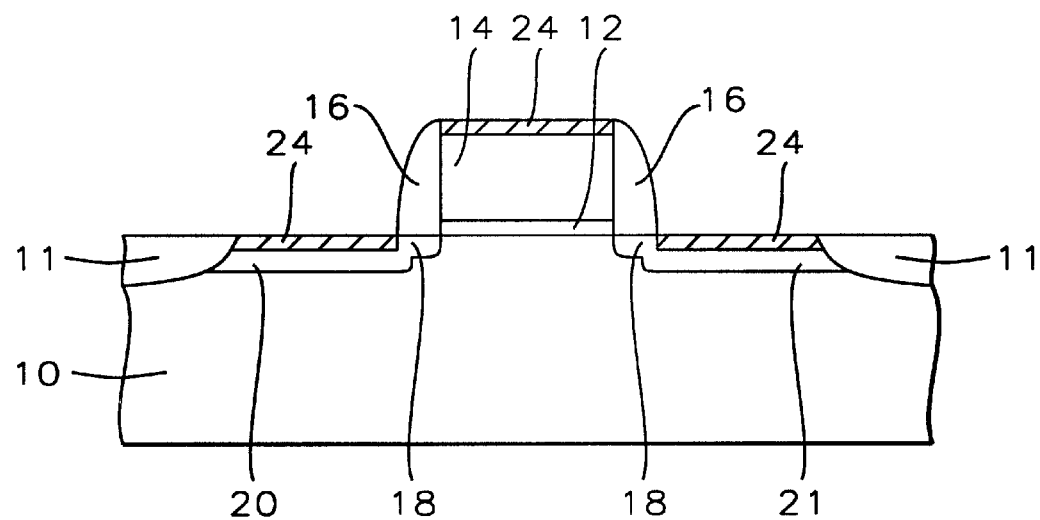
FIG. 6

METHOD OF FABRICATING BORDERLESS CONTACT USING GRADED-STAIR ETCH STOP LAYERS

BACKGROUND OF THE INVENTION (1) Field of the Invention

The invention relates to the fabrication of integrated circuit devices, and more particularly, to a method a creating borderless contact holes.

(2) Description of the Prior Art

The continued striving in the semiconductor industry for improving the performance of semiconductor devices has led to a continued trend in the reduction of device parameters and a reduction in the lengths of paths that are required to interconnect semiconductor devices. Device densities have as a consequence increased dramatically as have the number of semiconductor chips that can be created using one substrate, thus controlling and reducing the device costs. All of these trends have been made possible by gradual but significant advances in the available technologies and tools while continued advances in the materials that can be applied for the implementation of device characteristics have been key to the advancements that have been achieved in the semiconductor industry. Most significant in the new methods that have been applied in the creation of semiconductor devices are advances in methods and tools of photolithography (in addition to the application of more sensitive photoresist materials) and the application of new, dry etching procedures, most notably the application of Reactive Ion Etching (RIE).

As previously stated, higher device performance and improved functional capacity in integrated circuits require reduction of device Critical Dimensions (CD) and increased packaging density of the devices. Such requirements however require tight tolerance of pattern definition. To meet the required tolerance of critical dimensions presents a challenge to conventional photolithographic techniques for patterning contacts for very small sub-micron or sub-half-micron or even sub-quarter-micron modern silicon devices. Silicides are often used to reduce contact resistance in forming contact points to gate electrodes of a MOSFET device. The method of self-aligned silicide (salicide) formation helps to solve the problem of critical dimension tolerance. Using this method, the contact points that are formed for the source and the drain of the gate electrode self-align with the polysilicon gate. Salicides are therefore almost universally applied in today's high-density MOSFET devices.

There are however problems associated with methods of salicide formation such as the consumption of silicon underlying the metal, resulting in the consumption of silicon (of the substrate) over the surfaces of the source and drain regions, resulting in creating source/drain regions that are extremely thin. A further problem is that the salicidation reaction can consume substrate silicon unevenly, leading to ragged source/drain junctions. Another problem that is directly related to the reduction in device CD's is that electrical shorts can occur between the contact points that are formed over the gate structure and the source/drain regions. It is therefore, with ever smaller device dimensions, becoming increasingly more difficult to create gate and source/drain points of electrical contact while maintaining the required low sheet resistance and low junction leakage current for the contact points. Of special concern in this respect is the potential for misalignment of the photolithographic exposure for the creation of points of contact to the source/drain regions of a CMOS device. This can result in a contact opening that is too far removed from the CMOS device, partially exposing the non-salicided surface of the silicon substrate, or in a contact opening that is too close to the CMOS device, partially exposing the gate electrode spacers and creating the risk of etching (the contact opening) to the silicon substrate or causing a short with the (polysilicon of the) gate electrode. The invention addresses these concerns by providing a method of creating borderless contacts using a graded-stair dielectric layer as an etch stop layer.

U.S. Pat. No. 6,074,908 (Huang) shows a borderless contact method.

U.S. Pat. No. 6,072,237 (Jang et al.) and U.S. Pat. No. 6,046,103 (Thei et al.) show borderless contact processes with stop layers.

SUMMARY OF THE INVENTION

A principle objective of the invention is to provide a method of creating borderless contact holes using multiple layers of overlying dielectric that function as an etch stop layer for the creation of a borderless contact hole.

Another objective of the invention is to create a borderless contact hole of improved contact resistance and of improved leakage current performance characteristics.

Yet another objective of the invention is to provide a contact hole for contacting source/drain regions of a CMOS device whereby the proximity of the contact hole to adjacent surface regions of Field Isolation oxide is reduced.

A still further objective of the invention is to provide a method of creating a borderless contact hole whereby control of Critical Dimensions of the contact hole can be relaxed.

A still further objective of the invention is to create a borderless contact hole through a layer of dielectric overlying at least one gate electrode whereby the control of the thickness of the layer of dielectric can be relaxed.

A still further objective of the invention is to provide a method of creating a borderless contact hole whereby the alignment between the photolithographic exposure for the contact hole and the subsequently performed etch of the contact hole can be relaxed.

In accordance with the objectives of the invention a new method is provided for the creation of borderless contact holes that are created to the source/drain regions of CMOS devices. A gate electrode is created over the surface of a substrate, three consecutive, relatively thin layers of dielectric are deposited over the exposed surfaces of the gate electrode and the surface of the substrate surrounding the gate electrode. From these three layers an etch stop layer is created for the etching of the contact hole through the main, relatively thick layer of dielectric that is deposited overlying the gate electrode. By selecting known and mutually dependent etch rates for the three relatively thin layers of dielectric, the etch of these three layers can be controlled, thereby controlling the depth and the surface area that is being etched in an interdependent manner through the three layers of dielectric. An opening can therefore be etched through the upper two layers of dielectric, leaving the lower layer of dielectric in place overlying the surface of the source/drain regions. The main, relatively thick layer of dielectric overlying the gate electrode and through which contact holes are to be created is then deposited, contact holes are etched through this main layer of dielectric aligned with the holes that have been etched through the upper two layers of the etch stop layer. The lower layer of the three relatively thin layers of dielectric serves as an etch stop layer for the etch of the contact hole through the main layer of dielectric, the lower layer is partially removed after the contact hole has been etched through the main layer of dielectric.

BRIEF DESCRIPTION OF THE DRAWINGS

FIGS. 1 through 5 show prior art methods of creating contact holes to points of electrical contact of a gate electrode, as follows:

FIG. 1 shows a cross section of the Prior Art formation of a gate electrode structure up to the point of salicidation.

FIG. 2 shows a cross section of the Prior Art formation of a gate electrode structure after salicidation of the contact points for the gate electrode has been completed.

FIG. 3 shows a cross section of the Prior Art formation of a gate electrode structure after a layer of dielectric has been deposited over the surface of the gate electrode, openings have been created in the layer of dielectric and a layer of metal has been deposited and patterned to establish electrical continuity between the gate electrode (surface of the gate electrode and the source/drain regions) and a network of interconnecting lines.

FIG. 4 shows a cross section of the Prior Art formation of a gate electrode structure whereby a contact hole to the drain region is misaligned in the direction of the adjacent region of Field Isolation oxide.

FIG. 5 shows a cross section of the Prior Art formation of a gate electrode structure whereby a contact hole to the drain region is misaligned in the direction of the gate electrode.

The invention is described using drawings 6 through 11, as follows:

FIG. 6 shows a cross section of a gate electrode formed over the surface of a substrate.

Figure 7:
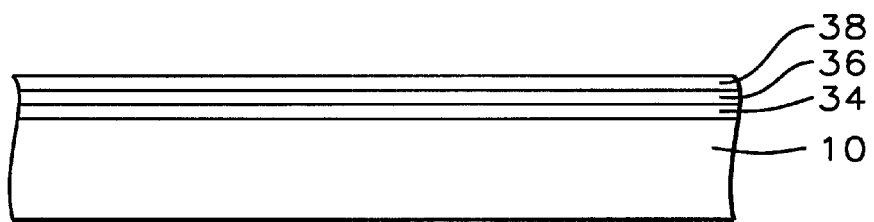

FIG. 7 shows a cross section of three relatively thin layers of dielectric which are consecutively deposited over a semiconductor surface.

Figure 8:
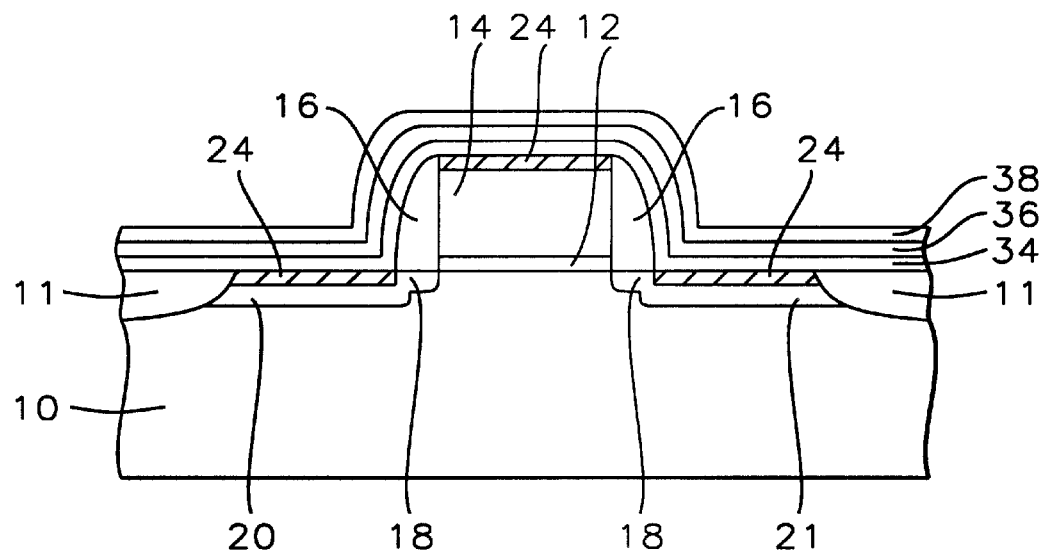

FIG. 8 shows a cross section of a gate electrode formed over the surface of which three relatively thin layers of dielectric have consecutively been deposited.

Figure 9:
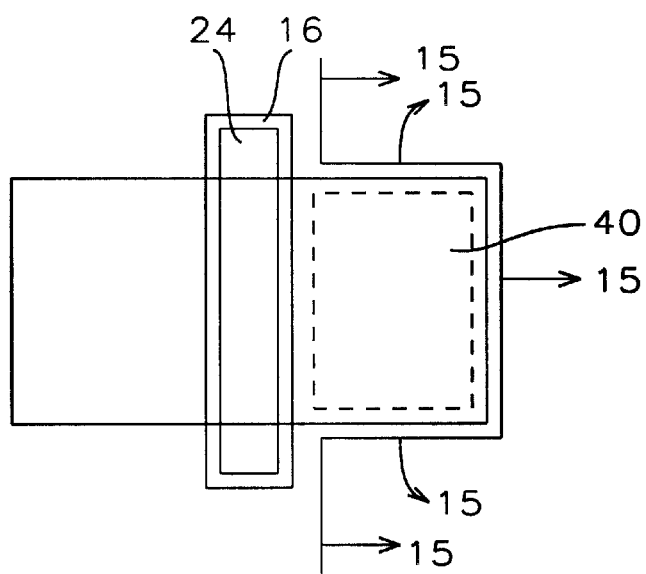

FIG. 9 shows a top view of the structure that is shown in cross section in FIG. 8, in FIG. 9 the surface region of the three thin layers of dielectric that is etched by the invention is highlighted.

Figure 10:
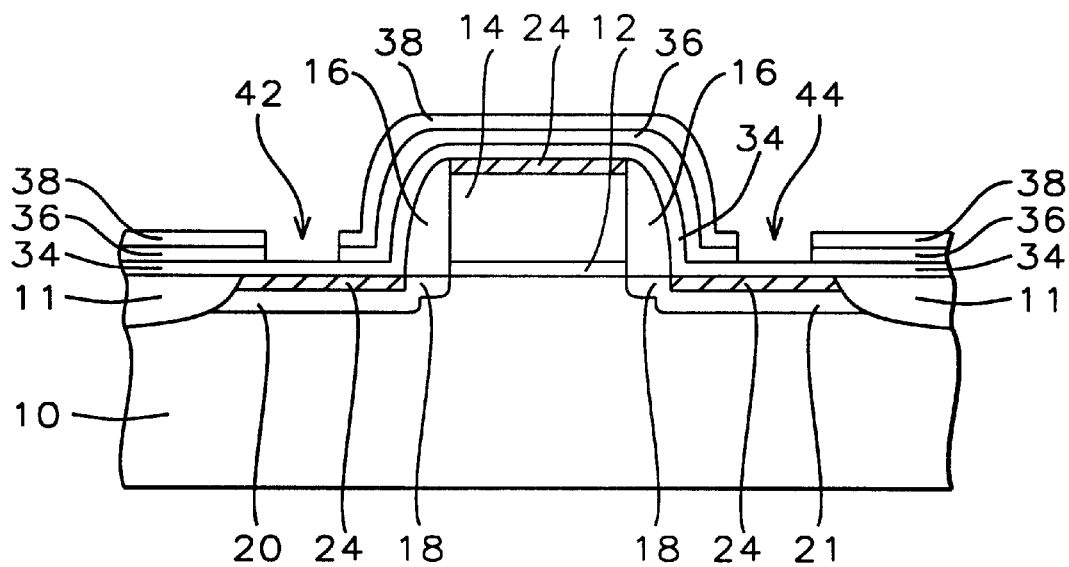

FIG. 10 shows a cross section of the gate electrode after the top two layers of thin dielectric have been etched.

Figure 11:
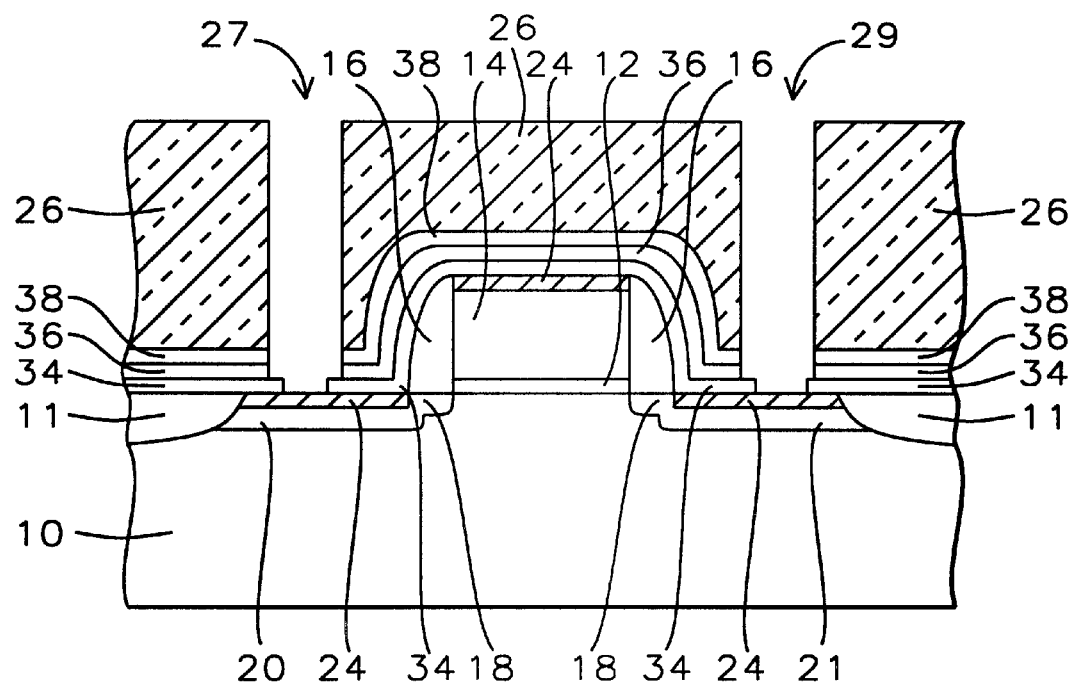

FIG. 11 shows a cross section of the gate electrode after the main layer of dielectric has been deposited, contact holes have been created through the main layer of dielectric that align with the holes that have been created through the top two layers of thin dielectric, the bottom layer of thin dielectric has been etched, exposing the surface of the source/drain regions of the gate electrode.

DESCRIPTION OF THE PREFERRED EMBODIMENTS

In order to form metal contacts to semiconductor devices., such as gate contacts and source/drain diffusion region contacts of a CMOS device, a via or opening is etched through a layer of dielectric, which allows for an upper metal layer being interconnected with a lower conductive layer. Typically, a nitride etch stop layer is formed over the surface to which the metal contact is to be established. This is followed by depositing a layer of dielectric, typically comprising oxide, over the surface of the etch stop layer. A photoresist mask is formed over the layer of dielectric, which is exposed and developed to define the desired pattern of openings to be etched through the underlying layer of dielectric. In order to form the contact openings, the dielectric layer is etched selectively to the underlying (of for instance nitride) etch stop layer. Then the exposed nitride layer is removed (e.g. by hot $H_3PO_4$) and then a liner (e.g. Ti/TiN) and contact metal (e.g. tungsten) is deposited in the openings followed by removal of the photoresist and surface planarization of the device.

The formation of a conventional n-type channel MOS device that has salicided source/drain contacts in addition to a salicided gate electrode will be described first. FIG. 1 shows a cross section of a p-type semiconductor surface 10, field isolation regions 11 of thick oxide have been provided in the surface of the substrate to define the active region of the substrate. A thin layer 12 of gate oxide has been formed using methods of thermal oxidation, a layer 14 of polysilicon is deposited over the surface of the gate oxide layer 12, this deposited layer 14 of poly is provided with a n-type conductivity and patterned to form the body of the gate electrode. The etch that is required to form the body of the gate electrode removes the deposited layer of poly and the deposited layer of gate oxide in accordance with the pattern of the gate electrode. An n-type ion implant 18 is performed into the surface of the substrate, this implant is self-aligned with the gate electrode and forms the LDD regions of the gate electrode. The gate spacers 16 are next formed by a blanket CVD deposition of a layer of silicon oxide over the surface of the gate electrode and its surrounding area, the layer 16 of silicon oxide is then anisotropically etched, thereby forming the gate spacers 16 on the sidewalls of the gate electrode. A second, relatively deep and heavily doped n-type implant 20/21 is performed into the surface of the substrate 10 to form the source and drain regions 20/21 of the gate electrode 14. The region 18 of the LDD is now concentrated under the spacers 16 of the gate electrode.

The next step in the process is the step of forming contacts with the gate electrode source (20) and drain (21) regions and the surface of the gate electrode 14. A layer 24 of refractory metal is blanket deposited over the entire structure that is shown in FIG. 1. The structure is then subjected to a heat treatment, which causes layer 24 to react with the underlying layer 14 of poly and the underlying surface of the source and drain regions 20 and 21 whereby this layer of refractory metal 24 is fully converted to a silicide. The unreacted refractory metal has not formed silicide and is removed by applying a selective etch that essentially removes the unreacted metal from the surface of the gate electrode spacers 16, leaving the silicided metal in place over the surface of the source 20 and drain 21 regions in addition to leaving the silicided metal in place over the surface of the gate electrode 14. A cross section of the gate structure after the unreacted refractory metal has been removed from the structure is shown in FIG. 2 where the layers 24 form the points of electrical contact to the gate electrode and the source and drain regions of this gate electrode.

FIG. 3 shows how the gate electrode of the Prior Art can be completed. A layer 26 of dielectric is deposited over the surface of the structure that is shown in cross section in FIG. 2, openings 27, 28 and 29 are etched through this layer 26 of dielectric. Opening 27 aligns with the source region 20 of the gate electrode, opening 28 aligns with the top surface of the gate electrode 14 and opening 29 aligns with the drain region 21 of the gate electrode. A layer of metal is then blanket deposited over the surface of the layer 26 of dielectric, including the openings 27, 28 and 29. This latter layer of metal is patterned and etched, creating the electrical contact 30 with the source region 20 of the gate electrode, contact 31 with the top surface of the gate electrode and contact 32 with the drain region 21 of the gate electrode. These three electrical contact points are typically connected to a surrounding network of interconnect metal lines. Layer 26 of dielectric is typically deposited to a thickness between about 5,000 and 15,000 Angstrom.

Prior art methods for the creation of borderless contacts (openings 27 and 29, FIG. 3) use the layer 26 of dielectric as an etch stop layer in order to improve leakage currents for cases where the contact openings 27 and 29 extend toward the polysilicon 14 of the gate electrode or towards the regions 11 of Field Isolation. This approach however is restricted and suffers from processing compromises that must be made between the allowable leakage current (between the contact plugs 30/32 and the gate structure 14 or between the contact plugs 30/32 and adjacent regions 11 of Field Isolation) and the contact resistance with the surface of the source (20) and drain (21) regions of the gate electrode. An effect on the efficiency of the etch for openings 27 and 29 is further experienced by the thickness of layer 26 of Intra Level Dielectric (ILD) and variations in etch rate that are experienced during the etching of these openings. That is to say, longer etch time results in lower contact resistance to the surface regions of the source/drain regions but at the expense of relatively poor leakage performance. Inversely, shorter etch time results in lower leakage currents but at the expense of poor, that is high, contact resistance to the surface regions of the source/drain regions. By therefore applying only one etch recipe (to the layer 26 of dielectric), it is difficult to find an optimum process whereby both the contact resistance and the leakage current are as required, that is low contact resistance and low leakage currents. The invention therefore provides for graded, staircase dielectric layers that are applied as stop layers and that provide additional means of optimizing the performance of the above-cited parameters of leakage current and contact resistance. This method of the invention is further explained using FIG. 6 through 10.

FIGS. 4 and 5 show the results that are obtained for applications where the contact plug to the drain region of a gate electrode is misaligned, as follows:

FIG. 4 shows an application where the opening 29' is too close to one of the region 11 of Field Isolation, resulting in a plug 32' that is shorted to the underlying region 11 of field isblation oxide.

FIG. 5 shows a cross section of an opening 29" which is too close to the gate electrode, resulting in a plug 32" which is prone to causing an electrical short between the plug 32" and the poly 14 of the gate electrode.

The invention is explained using FIGS. 6 through 11. Referring now to FIG. 6, there is shown a cross section that is essentially the same as the cross section that has been shown in FIG. 2, that is a gate electrode has been created, the contact regions to the gate electrode have been salicided. The height of the salicided surfaces 24 and of the regions 11 of Field Isolation have, for convenience of presentation, reduced without however changing the creation or the functionality of these salicided surfaces.

Since all the elements that are highlighted in the cross section that is shown in FIG. 6 have previously been discussed, these elements do not need to be further discussed at this time. The cross section that is shown in FIG. 6 is the "base construct" that is used by the invention.

Of key importance to the invention are the layers of semiconductor material that are deposited over the surface of the base construct of FIG. 6. These layers have, as previously highlighted, as objective to provide the ability to create contact holes through a layer of dielectric such that these contact holes do not suffer from negative effects caused by adjacent or surrounding semiconductor elements (such as STI regions) or materials (such as polysilicon that is used for the creation of a gate electrode).

These three layers of semiconductor material are shown in cross section in FIG. 7 and can be described as follows:

layer 34, a bottom layer of dielectric, further referred to as dielectric-1, comprising SiN or SiON or a combination thereof, deposited to a thickness of between about 100 and 1,000 Angstrom layer 36, a center layer of dielectric, further referred to as dielectric-2, comprising silicon oxide, deposited to a thickness of between about 100 and 500 Angstrom, and layer 38, a top layer of dielectric, further referred to as dielectric-3, comprising SiN or SiON or a combination thereof, deposited to a thickness of between about 100 and 1,000 Angstrom.

Processing conditions for the deposition of these layers are well known in the art. For instance, layer 36 of silicon oxide can be a plasma enhanced CVD (PE CVD) layer of oxide, deposited at a chamber pressure between about 1 and 3 Torr, a temperature between about 300 and 500 degrees C. with reacting gasses $SiH_4$ and $N_2O$ at a flow rate between about 10 and 2000 sccm in a diluent carrier gas at a flow rate between about 0 to 10,000 sccm and an rf power between about 50 and 2000 KeV to a thickness between about 100 and 500 Angstrom. Layer 36 of silicon dioxide ($SiO_2$) can also be grown using a LPCVD reactor, at a temperature between about 700 and 950 degrees C. and preferably between 800 and 900 degrees C. at pressure between about 0.7 and 1.0 inTorr and preferably between about 0.8 and 0.9 mTorr.

Layers 34 and 38 of silicon nitride can be formed using any suitable technique including CVD techniques, such as LPCVD or PECVD. In one embodiment, the layers 34 and 38 of silicon nitride can be created using a one step PECVD or LPCVD technique such as simultaneously employing gasses containing silicon and nitrogen, such as using $SiH_4$ of $SiCl_{2H2}$ and $N_2$ or $NH_3$. In another embodiment, the silicon nitride layers 34 and 38 can be created using LPCVD techniques ($SiCl_2H_2$ and $NH_3$) and contains $Si_3N_4$.

More specifically, layers 34 and 38 of silicon nitride ($Si_3N_4$) can be deposited using PECVD procedures at a pressure between about 200 mTorr and 400 mTorr, at a temperature between about 350 and 450 degrees C., to a thickness of between about 1000 to 5000 Angstrom using $NH_3$ and $SiH_4$ or $SiCl_2H_2$. Layers 34 and 38 of silicon nitride can also be deposited using LPCVD or PECVD procedures using a reactant gas mixture such as dichlorosilane ($SiCl_2H_2$) as a silicon source material and amonia ($NH_3$) as a nitrogen source, at a temperature between about 600 and 800 degrees C., at a pressure between about 300 mTorr and 400 mTorr, to a thickness between about 200 and 300 Angstrom.

Layers 34 and 38 of Silicon Oxynitrides typically have characteristics that are a combination of both silicon and nitride, the general formula for SiON is $SiO_xN_y(H_z)$. Silicon Oxynitrides are formed by creating $SiH_4$ with $N_2O$ and $NH_3$. In order to form a non-conformal layer of SiON, a practical application uses $SiO_xN_y$ deposited by PECVD with a gas flow between about 1700 and 2300 sccm of He, a gas flow of between about 80 and 120 sccm of $N_2O$, a gas flow of between about 40 and 200 sccm of $SiH_4$, at a temperature of between about 380 and 480 degrees C. and at a pressure between about 5 and 8 Torr. A typical carrier gas for the formation of a layer of $SiO_xN_y$ is N2 or He.

The invention will further be described using as an example the formation of a borderless contact hole to source/drain regions of a CMOS device. This does however not limit the invention to creating borderless contact holes that are used for establishing electrical contact with gate electrodes only. The invention can be applied to create a borderless contact hole that aligns with any point of electrical contact that is provided over a semiconductor surface, such as a point of electrical contact in the surface of a substrate whereby the point of electrical contact is not associated with a gate electrode. The borderless contact hole is for these applications created in a relatively thick layer of dielectric that overlies the semiconductor surface over which a point of electrical contact has been provided. The invention is independent of the nature of the surface over which the relatively thick layer of dielectric is deposited nor is the invention dependent on the features that have been created in or on the surface over which the relatively thick layer of dielectric is deposited.

Referring now to FIG. 8, there is shown a cross section of the gate electrode after the three layers 34, 36 and 38 that have been described under FIG. 7 have been conformally deposited over the surface of the gate electrode, including the salicided surface of the source (20) and drain (21) regions and the Field Isolation regions (11) that have been defined in the surface of substrate 10.

To more clearly define the surface regions of the layers 34, 36 and 38 to which an etch process will be applied in order to create a contact hole through these layers, FIG. 9 shows a top view of the surface of the gate electrode with element 24 being the salicided surface of the polysilicon layer 14 and 16 being the gate spacers of the gate electrode. Regions 15 are the regions of Field Isolation, such as regions 11 in FIG. 8 while the surface region 40, which is bounded by a dotted line, is the region to which the etch of layers 34, 36 and 38 is applied.

Layers 34, 36 and 38 are, as has been indicated, of different material meaning that different etch rates can be achieved for these layers. The etch rates of the three layers 34, 36 and 38 have been selected as follows:

the etch rate of dielectric-3 is high when compared with the etch rate of dielectric-2, and the etch rate of dielectric-2 is low when compared with the etch rate of dielectric-1.

After layer 34, 36 and 38 have been deposited as shown in cross section in FIG. 8, these layers are etched, creating an opening through these layers that aligns with the surface of the salicided source/drain regions of the gate electrode. The etch sequence is as follows:

define a pseudo-active region, that is region 40 as shown in top view in FIG. 9, using convention processing of photoresist coating and patterning and developing the coated layer of photoresist; a photoresist mask is created in this manner that exposes the surface of layer 38 of dielectric-3, FIG. 8, in accordance with the boundaries (dotted line) surrounding region 40 of FIG. 9 create an opening through the layer of dielectric-3 in accordance with the created photoresist mask and that therefore aligns with the surface of the source/drain regions of the gate electrode; this etch uses the layer of dielectric-2 as an etch stop since dielectric-2 has a low etch rate when compared with dielectric-3;

form graded-stair stop layers by removing the layer of dielectric-2 (in accordance with the opening created in the overlying layer of dielectric-3).

Layer 38 of silicon nitride can be etched using a SiON or SiN removal process with etchant gasses $CH_3F/Ar/O_2$ at a temperature between about 10 and 20 degrees C., a pressure of between about 50 and 60 mTorr with an etch time of between about 40 and 60 seconds. The silicon nitride layer 38 can also be wet etched using a buffered oxide etchant (BOE). The BOE may comprise a mixed solution of fluoroammonium and fluorohydrogen (7:1) and phosphoric acid solution. The silicon nitride layer 38 can further be etched using anisotropic RIE using $CHF_3$ or $SF_6$-$O_2$ as an etchant. The preferred method of removing silicon nitride is an isotropic wet etch process using hot phosphoric acid. The silicon nitride layer 38 can also be dipped into phosphoric acid ($H_3PO_4$) to be removed. The thermal oxidation layer can be removed by dipping into hydrogen fluoride (HF). The layer 38 of silicon nitride can be anisotropically etched with a plasma gas containing fluorocarbon gases such as $CF_4$/$CHF_3$ chemistry or $Co/C_4F_8$ chemistry, in a commercial RIE etcher or an electron cyclotron resonance (ECR) plasma reactor.

It must be pointed out that the purpose of layer 36 of silicon oxide (dielectric-2) is to maintain good thickness uniformity of the underlying layer of dielectric-1 after the layer 38 of dielectric-3 has been removed. The layer 38 can, as stated, contain either SiN or SiON of a combination of SiN and a combination of SiN and SiON and, because of this selection of materials, provides a "graded-stair" etch concept. That is the sides of the openings that are etched through layer 38 of dielectric-3 and the (underlying) layer of dielectric-2 (of silicon oxide) have a sloping profile, the etch tends to not completely remove these layers of dielectric-3 and dielectric-2 from around the perimeter of the bottom of the opening that is etched through these layers. This concept is important to the invention since the material (dielectric) that is not completely removed from around the perimeter of the bottom of the opening that is created through the layers of dielectric is the material that is used by the invention to retain a "buffer" of material that separates the bottom of the created contact hole from surrounding elements.

By following the above highlighted etching sequence, the cross section that is shown in FIG. 10 is obtained, that is opening 42 is created through layer 36 and 38 that is aligned with the salicided surface 24 of source region 20 and opening 44 is created through layer 36 and 38 that is aligned with the salicided surface 24 of drain region 21. Openings 42 and 44 expose the surface of layer 34. It must again be noted that in the etch sequence that has been followed in order to gain the cross section that is shown in FIG. 10, the layer 36 of dielectric-2 forms a buffer layer between the two layers 34 and 38 which essentially comprise nitride. Key to the cross section that is shown in FIG. 10 is that layer 34 of dielectric-1 remains in place overlying the salicided surfaces 24 of the source/drain regions of the gate electrode. By partially removing this layer 34, leaving in place this layer 34 of silicon nitride or silicon oxynitride around the perimeter of the openings 42 and 44, the remaining layer 34 provides a recess control for the opening that is created to form contact plugs to the salicided surface of the source/drain regions. This is shown in cross section in FIG. 11, where:

a layer 26 of Intra Metal dielectric has been deposited over the surface of layer 38, including the exposed surface of layer 34; layer 26 has been polished after deposition by applying methods of Chemical Mechanical Polishing (CMP)

openings 27 and 29 have been etched through layer 26 of IMD, using conventional methods of photoresist coating and photolithography layer 34 of SiN/SiON has been etched, creating openings through layer 34 that align with the salicided surfaces 24 of the source/drain regions of the gate electrode; the etch of layer 34 has left in place a layer of SiN/SiON around the perimeter of the opening that is created through layer 34. The opening that has been etched through layer 34 exposes the salicided surface of the source/drain regions of the gate electrode, enabling the establishing of electrical contact with these surfaces.

It is further clear from the cross section that is shown in FIG. 11 that layers 34, 36 and 38, which along the lower extremes of openings 27 and 29 surround these openings, form a tri-layer interface between the contact plug (to be created in openings 27 and 29) and the surrounding regions 11 of Field Isolation and the gate spacers 16 and polysilicon 14 of the gate electrode.

The structure that is shown in cross section in FIG. 11 can now be completed for further interconnect of the gate electrode by applying convention methods of metal deposition and the like, as previously highlighted under FIG. 3.

The etch sequence of the various layers is as follows:

1. layer 38 is etched first, then
2. layer 36 is etched using a dry or wet solution, then
3. a contact etch is performed on layer 26, and then
4. layer 34 is etched, stopping on the salicide region.

Since layer 36 serves as a buffer for layer 34, this layer 36 may or may not be etched. The etch of layer 36 can therefore also be performed after step #3 above.

The invention can further be extended to deposit layers of barrier material (not shown) and seed material (not shown) over the inside surfaces of the openings 27 and 29 that have been created in layer 26 of dielectric. Barrier layers are typically used to prevent diffusion of the interconnect metal into surrounding layers of dielectric and silicon. Some of the considerations that apply in selecting a material for the barrier layer become apparent by using copper for interconnect metal as an example. Although copper has a relatively low cost and low resistivity, it has a relatively large diffusion coefficient into silicon dioxide and silicon and is therefore not typically used as an interconnect metal. Copper from an interconnect may diffuse into the silicon dioxide layer causing the dielectric to be conductive and decreasing the dielectric strength of the silicon dioxide layer. Copper interconnects should be encapsulated by at least one diffusion barrier to prevent diffusion into the silicon dioxide layer. Silicon nitride is a diffusion barrier to copper, but the prior art teaches that the interconnects should not lie on a silicon nitride layer because it has a high dielectric constant compared with silicon dioxide. The high dielectric constant causes a desired increase in capacitance between the interconnect and the substrate.

A typical diffusion barrier layer may contain silicon nitride, phosphosilicate glass (PSG), silicon oxynitride, aluminum, aluminum oxide ($Al_xO_y$), tantalum, Ti/TiN or Ti/W, nionbium, or molybdenum and is more preferably formed from TiN. The barrier layer can also be used to improve the adhesion of the subsequent overlying tungsten layer.

A barrier layer is preferably about 100 and 500 angstrom thick and more preferably about 300 angstrom thick and can be deposited using rf sputtering.

A seed layer is frequently deposited over the surface of a barrier layer. The seed layer may contain a pure metal and may also contain a doped metal, dependent on the fill that is used to create the metal plug in openings 27 and 29 of FIG. 11. The purpose of the seed layer is to enhance adhesion of the metal plug to the surfaces of the openings 27 and 29 in which the metal plug is created. The metal that is therefore typically used for the seed layer is the same metal that is used to create the metal plug. Doping that may be added to the layer is at times provided based on considerations of surface oxidation or other surface damage that may be incurred by the seed layer during exposure to either atmospheric or processing environments. Seed layers are typically deposited to a thickness of between about 200 and 400 Angstroms and can be deposited using rf sputtering techniques.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. The creation of a borderless contact hole, comprising the steps of:

providing a semiconductor surface, at least one point of electrical contact having been provided over said semiconductor surface;

consecutively depositing over said semiconductor surface a first layer of dielectric over which a second layer of dielectric is deposited over which a third layer of dielectric is deposited, said first layer of dielectric having an etch selectivity which is high when compared with an etch selectivity of said second layer of dielectric, said third layer of dielectric having an etch selectivity which is high when compared with an etch selectivity of said second layer of dielectric;

patterning and etching said third and said second layer of dielectric, creating at least one opening through said third and said second layers of dielectric that aligns with said at least one point of electrical contact provided over said semiconductor surface;

depositing a layer fourth layer of dielectric over the surface of said third layer of dielectric, including inside surfaces of said least one opening through said third and said second layers of dielectric, said fourth layer of dielectric being deposited to a thickness between about 5,000 and 15,000 Angstrom;

patterning and etching said fourth layer of dielectric, creating at least one opening through said fourth layer of dielectric that aligns with said at least one opening created through said third and said second layers of dielectric, exposing the surface of said first least of dielectric inside said at least one opening created through said third and said second layers of dielectric; and etching said exposed surface of said first layer of dielectric, creating at least one opening through said fourth, third, second and first layers of dielectric that aligns with said at least one point of electrical contact provided over said semiconductor surface, substantially removing said exposed first layer of dielectric from a bottom surface of said at least one opening through said fourth, third, second and first layers of dielectric, leaving in place a measurable amount of said first layer of dielectric around a perimeter of a bottom surface of said opening created through said fourth, third, second and first layers of dielectric, creating a graded lower profile of said at least one opening created through said fourth, third, second and first layers of dielectric whereby a diameter of said at least one opening created through said fourth, third, second and first layers of dielectric decreases by a measurable amount when proceeding from said fourth layer of dielectric to said third layer of dielectric to said second layer of dielectric to said first layer of dielectric.

2. The method of claim 1 wherein said first layer of dielectric is selected from the group consisting of silicon nitride and silicon oxynitride and a combination thereof.

3. The method of claim 1 wherein said second layer of dielectric comprises silicon oxide.

4. The method of claim 1 wherein said third layer of dielectric is selected from the group consisting of silicon nitride and silicon oxynitride and a combination thereof.

5. The method of claim 1 wherein said at least one point of electrical contact provided over said semiconductor surface comprises a surface of a source region of a CMOS device and a surface of a drain region of a CMOS device.

6. The method of claim 5 wherein said surface of a source region of a CMOS device and said surface of a drain region of a CMOS device have been salicided.

7. The method of claim 1 wherein said semiconductor surface comprises a silicon substrate.

8. The method of claim 1 wherein said fourth layer of dielectric comprises a layer of Intra Level Dielectric.

9. The method of claim 1 with an additional processing step of depositing a barrier layer over inside surfaces of said at least one opening created through said fourth, third, second and first layer of dielectric layer of dielectric.

10. The method of claim 9 with an additional step of depositing a seed layer over said barrier layer.

11. The method of claim 1 with an additional step of planarizing said fourth layer of dielectric, said additional step being performed after said step of depositing a layer fourth layer of dielectric over said third layer of dielectric.

12. The method of claim 1 with additional processing steps of creating a metal plug in said at least one opening created through said fourth, third, second and first layer of dielectric.

13. The method of claim 1, said first layer of dielectric being deposited to a thickness between about 100 and 1,000 Angstrom.

14. The method of claim 1, said second layer of dielectric being deposited to a thickness between about 100 and 500 Angstrom.

15. The method of claim 1, said third layer of dielectric being deposited to a thickness between about 100 and 1,000 Angstrom.

16. The creation of a borderless contact holes to source and drain regions of a CMOS device, comprising the steps of:

providing a semiconductor surface, at least one gate electrode having been provided over said semiconductor surface, said at least one gate electrode having been provided with points of electrical contact to source and drain regions that are self-aligned with said at least one gate electrode;

consecutively depositing over said semiconductor surface including exposed surfaces of said at least one gate electrode a first layer of dielectric over which a second layer of dielectric is deposited over which a third layer of dielectric is deposited, said first layer of dielectric having an etch selectivity which is high when compared with an etch selectivity of said second layer of dielectric, said third layer of dielectric having an etch selectivity which is high when compared with an etch selectivity of said second layer of dielectric;

patterning and etching said third and said second layer of dielectric, creating at least one opening through said third and said second layers of dielectric that aligns with said point of electrical contact to a source region of said at least one gate electrode, further creating at least one opening through said third and said second layers of dielectric that aligns with said point of electrical contact to a drain region of said at least one gate electrode;

depositing a layer fourth layer of dielectric over said third layer of dielectric, including inside surfaces of said least one opening through said third and said second layers of dielectric, said fourth layer of dielectric being deposited to a thickness between about 5,000 and 15,000 Angstrom;

patterning and etching said fourth layer of dielectric, creating at least one opening through said fourth layer of dielectric that aligns with said at least one opening created through said third and said second layers of dielectric, exposing said first least of dielectric inside said at least one opening created through said third and said second layers of dielectric; and etching said exposed surface of said first layer of dielectric, creating at least one opening through said fourth, third, second and first layers of dielectric that aligns with said point of electrical contact to a source region of said at least one gate electrode, further creating at least one opening through said fourth, third, second and first layers of dielectric that aligns with said point of electrical contact to a drain region of said at least one gate electrode, substantially removing said exposed first layer of dielectric from a bottom surface of said at least one opening through said fourth, third, second and first layers of dielectric, leaving in place a measurable amount of said first layer of dielectric around a perimeter of a bottom surface of said opening created through said fourth, third, second and first layers of dielectric, creating a graded lower profile of said at least one opening created through said fourth, third, second and first layers of dielectric whereby a diameter of said at least one opening created through said fourth, third, second and first layers of dielectric decreases by a measurable amount when proceeding from said fourth layer of dielectric to said third layer of dielectric to said second layer of dielectric to said first layer of dielectric.

17. The method of claim 16 wherein said first layer of dielectric is selected from the group consisting of silicon nitride and silicon oxynitride and a combination thereof.

18. The method of claim 16 wherein said second layer of dielectric comprises silicon oxide.

19. The method of claim 16 wherein said third layer of dielectric is selected from the group consisting of silicon nitride and silicon oxynitride and a combination thereof.

20. The method of claim wherein said points of electrical contact to source and drain regions that are self-aligned with said at least one gate electrode have been salicided.

21. The method of claim 16 wherein said semiconductor surface comprises a silicon substrate.

22. The method of claim 16 wherein said fourth layer of dielectric comprises a layer of Intra Level Dielectric.

23. The method of claim 16 with an additional processing step of depositing a barrier layer over inside surfaces of said at least one opening created through said fourth, third, second and first layer of dielectric layer of dielectric.

24. The method of claim 23 with an additional step of depositing a seed layer over said barrier layer.

25. The method of claim 16 with an additional step of planarizing said fourth layer of dielectric, said additional step being performed after said step of depositing a layer fourth layer of dielectric over said third layer of dielectric.

26. The method of claim 16 with additional processing steps of creating a metal plug in said at least one opening created through said fourth, third, second and first layers of dielectric.

27. The method of claim 16, said first layer of dielectric being deposited to a thickness between about 100 and 1,000 Angstrom.

28. The method of claim 16, said second layer of dielectric being deposited to a thickness between about 100 and 500 Angstrom.

29. The method of claim said third layer of dielectric being deposited to a thickness between about 100 and 1,000 Angstrom.

* * * * *